(12) United States Patent
Chan et al.

(10) Patent No.: US 7,293,209 B2
(45) Date of Patent: Nov. 6, 2007

(54) SPLIT L2 LATCH WITH GLITCH FREE PROGRAMMABLE DELAY

(75) Inventors: Yuen H. Chan, Poughkeepsie, NY (US); Ryan T. Freese, Poughkeepsie, NY (US); Antonio R. Pelella, Highland Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 11/054,311

(22) Filed: Feb. 9, 2005

(65) Prior Publication Data

US 2006/0179375 A1    Aug. 10, 2006

(51) Int. Cl.
*G01R 31/28* (2006.01)

(52) U.S. Cl. .................................................. 714/724
(58) Field of Classification Search ......... 714/100–824
See application file for complete search history.

(56) References Cited

U.S. PATENT DOCUMENTS

| | | | | |
|---|---|---|---|---|
| 5,081,477 A | * | 1/1992 | Gibson | 347/133 |
| 5,305,451 A | * | 4/1994 | Chao et al. | 713/500 |
| 5,831,459 A | * | 11/1998 | McDonald | 327/141 |
| 6,115,836 A | * | 9/2000 | Churchill et al. | 714/726 |
| 6,192,092 B1 | * | 2/2001 | Dizon et al. | 375/371 |
| 6,380,785 B2 | * | 4/2002 | Fisher | 327/269 |
| 6,381,704 B1 | * | 4/2002 | Cano et al. | 713/600 |
| 6,701,466 B1 | * | 3/2004 | Fiedler | 714/699 |

* cited by examiner

*Primary Examiner*—James C. Kerveros
*Assistant Examiner*—Guerrier Merant
(74) *Attorney, Agent, or Firm*—Lynn L. Augspurger; Laurence J. Marhoefer

(57) ABSTRACT

A programmable delay circuit that delays the C2 clock signal by a variable amount that allows the output from the L1 latch to be captured even when there is a large delta between the L1 latch and its L2 latch. This allows the C2 signal to be adjusted within the system dependent upon the amount of cycle steal is needed. The C2 clock delay is inhibited during scan operation to prevent glitches and the trailing edge of the delayed C2 is controlled to maintain a constant C2 duty cycle.

2 Claims, 2 Drawing Sheets

SPLIT L2 LATCH WITH GLITCH FREE PROGRAMMABLE DELAY

CROSS REFERENCE TO RELATED APPLICATIONS

This application contains subject matter that is related to the subject matter of the following co-pending applications, each of which is assigned to the same assignee as this application, International Business Machines Corporation of Armonk, N.Y., and is filed concurrently herewith. Each of the below listed applications is hereby incorporated herein by reference. High Speed Domino Bit Line Interface Early Read and Noise Suppression, Ser. No. 11/094,296 2006/0176747; Global Bit Select Circuit With Dual Read and Write Bit Line Pairs, Ser. No. 11/054,309 2006/0176753; Local Bit Select Circuit With Slow Read Recovery Scheme, U.S. Pat. No. 7,102,946; Global Bit Line Restore Timing Scheme and Circuit, U.S. Pat. No. 7,170,774; Local Bit Select With Suppression, U.S. Pat. No. 7,113,433.

BACKGROUND OF THE INVENTION

1. Field of the Invention

This invention relates to L1-L2 latch chains, and more particularly to an improved programmable delay circuit for the L2 latch clock.

2. Description of Background

As will be appreciated by those skilled in the art, a latch circuit of the type contemplated by this invention has a data and a clock input. The data input state at the leading clock edge is transferred to the latch output. The output state is retained after the trailing edge of the clock, independent of changes in the input data. A common approach to memory logic uses one latch L1 as a master latch and another latch L2 as a slave latch, with the output of L1 coupled to the input of its associated L2 latch. The latches are connected in series to from a chain and separate clock signals (C1 and C2 respectively) are used to clock the L1 latches and the L2 latches. As will also be appreciated by those skilled in the art, one L2 latch is associated as a slave with each L1 latch in order to allow scan testing of the latch chain. In certain L1/L2 latch chains, where there is a large time delta between the data output of L1 and the data arrival at L2, the data is not reliably captured in the L2 latch. The prior art has proposed the use of a delay circuit to delay the clock signal C2 to the L2 latch. However, these proposals have not been all together successful. One problem with prior art proposals for delaying the L2 clock signal it that it introduces glitches. During test scan operations, the set(0-3) signals (FIG. 1) are constantly switching. This can cause glitching (unintended false switching to 1 or 0) on the delay_out signal, which can corrupt the data flow from L1 to L2. This corrupted data flow can directly affect the output since there is no other latch to preserve data integrity after the L2 latch. Another limitation of prior art C2 clock delay circuits is that they alter the duty cycle of original C2 signal.

SUMMARY OF THE INVENTION

One object of the invention is the provision of a C2 clock delay circuit that allows the output from an L1 latch to be captured in its L2 latch when there is a large delta between the two latches.

Another object of this invention is the provision of C2 clock delay circuit

Another object of this invention is the provision of C2 clock delay circuit that does not introduce a glitch in the L2 latch outputs as a result of a scan operation.

A further object of this invention is the provision of a C2 clock delay circuit that does not alter the duty cycle of the C2 clock signal.

Briefly, this invention contemplates the provision of a programmable delay circuit that delays the C2 clock signal by a variable amount that allows the output from the L1 latch to be captured even when there is a large delta between the L1 latch and its L2 latch. This allows the C2 signal to be adjusted within the system dependent upon the amount of cycle steal is needed. The C2 clock delay is inhibited during scan operation to prevent glitches and the trailing edge of the delayed C2 is controlled to maintain a constant C2 duty cycle.

BRIEF DESCRIPTION OF THE DRAWINGS

The subject matter that is regarded as the invention is particularly pointed out and distinctly claimed in the claims at the conclusion of the specification. The forgoing and other objects, features, and advantages of the invention are apparent from the following detailed description taken in conjunction with the accompanying drawings in which:

DETAILED DESCRIPTION OF THE INVENTION

Figure 1A:
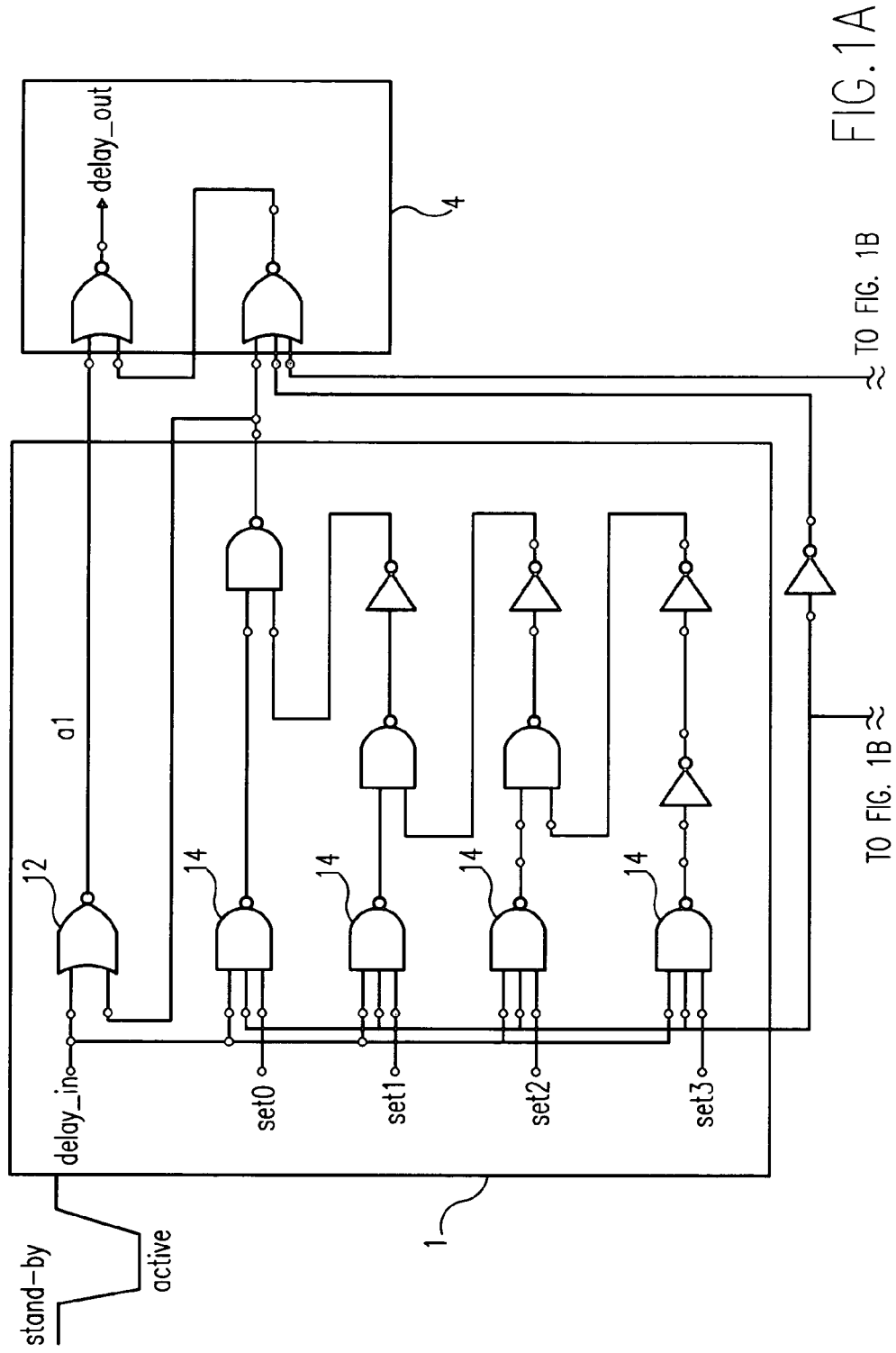
FIGS. 1A and 1B are diagrams, a partially block diagram and a partially schematic diagram, of one embodiment of a C2 clock delay circuit in accordance with teachings of this invention.
Figure 1B:
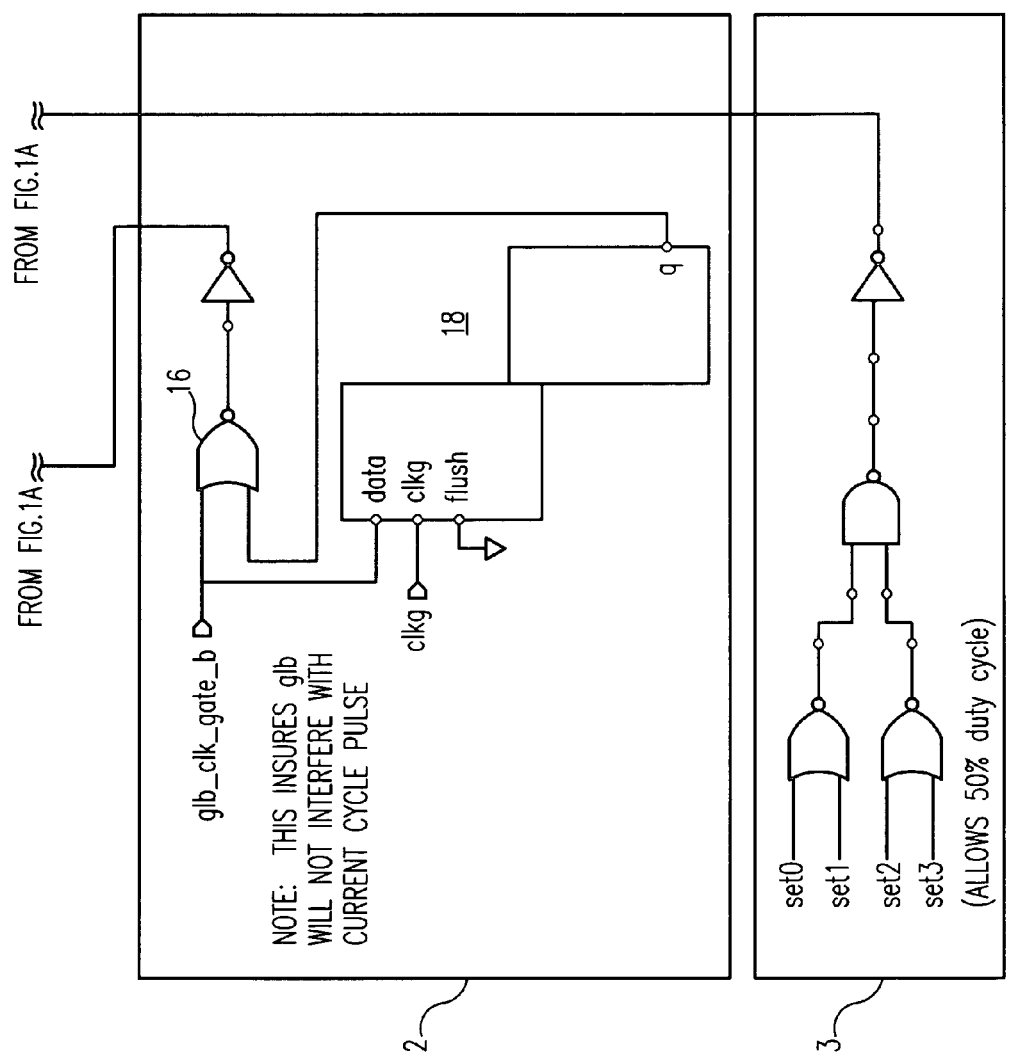

Referring now to FIGS. 1A and 1B, specific embodiment of the C2 delay clock generator of this invention shown in FIGS. 1A and 1B has four functional components; a programmable C2 clock delay circuit shown in block 1, a scan mode delay inhibit circuit shown block 2; a constant C2 clock cycle circuit shown in block 3, and C2 clock output circuit shown in block 4. In the programmable C2 clock delay circuit of block 1, the C2 clock is coupled via the delay_input terminal to an exclusive NOR gate 12 and to one input terminal of each of four exclusive three input AND gates 14. In this specific embodiment of the invention, the C2 clock is active low, and may be the complement of the C1 clock Programmable bits held in mode latches (not show) are coupled to the set0, set1, set2, and set3 inputs of the gates 14. The input in put of each gate 14 is connected to the C2 clock input terminal delay_in. The outputs of 14 are connected in a chain from bottom to top in the drawing. The amount of delay introduced is determined by which of the gates is selected by the programmable input, set0, set1, set2, or set3. The programmable input selects one of the gates 14, which determines the number of delay invertors in the path between the C2 clock input delay_in and the delayed clock output delay_out, which controls the C2 clock port of the L2 latch. If set0 is selected, the minimum delay is introduced. If set3 is selected, the maximum delay is introduced.

The circuit shown in block 2 disables any selected delay path during a scanning operation to prevent a glitch in the output. At the L2 stage of the L1/L2 latch, and glitch could corrupt the output data. During a scanning, the mode set bit inputs to the gates 14 are constantly changing, increasing the possibility of a glitch. A signal glb_clk_gate_b enables the scan mode. This signal is coupled as one input to an exclusive OR gate 16 whose output coupled as an input to each of the AND gates 14, and in response to the glb_clk-_gate_b input deselects gates 14. This enable scan mode signal is also coupled as in input to a latch 18 so that the output of gate 16 to deselect the gates 14 is delayed by one cycle to ensure that the current cycle is not interfered with when entering the scan mode. Since this is at the L2 stage of the L1/L2 latch, any glitch could corrupt the output data, and during scanning, and the mode bits are constantly changing creating a greater possibility of a glitch. However, when the system disables scan mode, the glb_clk_gate_b signal immediately turns on the circuitry in section 1 through the latch 18 and 'or' gate 16.

The duty cycle is preserved through the circuitry shown in block 3 of FIG. 1B. The delay circuitry in block 1 only affects the falling edge of the C2 clock signal. The circuitry in block 3 affects the rising edge as well, and thus preserves the duty cycle. The inputs to block 3 are the set(0-3) signals. When delay_in goes active, 'a1' signal eventually goes active, once 'a1' is active, the C2 clock signal (delay_out) immediately goes active due to the NOR gate driving delay_out. You could get the same functionality (without the duty cycle preservation) by just replacing block 4 with an inverter for signal 'a1'. If any of the set bits are active in block 3, the 3-input nor in block 4 becomes active. Now, when delay_in becomes inactive, 'a1' immediately goes inactive, but the output delay_out does not immediately become inactive. The NOR gates in block 4 force the delay_in signal to propagate through the delay circuitry in block 1. This pushes out the rising edge (inactive state) of delay_out, and preserves the duty cycle. ) This programmable delay circuit and the "Split L2 latch circuit", provide a cycle steal system with a wide range of allowable arrival times of data to the "Split L2 latch".

While the preferred embodiment of the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A programmable clock signal generator for generating a clock signal for an L2 stage of and L1-L2 latch, comprising in combination:
   a clock signal input to said clock signal generator and a delayed clock signal output from said clock signal generator;
   a programmable clock signal delay circuit having an input connected to said clock signal input terminal and an output coupled to said clock signal output terminal;
   said programmable clock signal delay circuit including a series of discrete delay elements connected between said clock signal input and said clock signal output, and binary inputs to each of a plurality of gates select one or more of said plurality of gates in order to determine a number of said discrete delay elements in said series; and
   a scan mode delay inhibit circuit that deselects all of said plurality of gates in response to a scan mode enable signal.

2. A programmable clock signal generator for generating a clock signal for an L2 stage of and L1-L2 latch, comprising in combination:
   a clock signal input to said clock signal generator and a delayed clock signal output from said clock signal generator;
   a programmable clock signal delay circuit having an input connected to said clock signal input terminal and an output coupled to said clock signal output terminal;
   said programmable clock signal delay circuit including a series of discrete delay elements connected between said clock signal input and said clock signal output, and binary inputs to each of a plurality of gates select one or more of said plurality of gates in order to determine a number of said discrete delay elements in said series; and
   a scan mode delay inhibit circuit that deselects all of said plurality of gates in response to a scan mode enable signal after a delay of one clock signal cycle.

* * * * *